US012777788B2

(12) United States Patent
Lee et al.

(10) Patent No.: US 12,777,788 B2
(45) Date of Patent: Oct. 27, 2026

(54) DISPLAY DEVICE

(71) Applicant: Samsung Display Co., Ltd., Yongin-si (KR)

(72) Inventors: Minsu Lee, Yongin-si (KR); Swaehyun Kim, Yongin-si (KR); Youhan Moon, Yongin-si (KR); Jeongho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 770 days.

(21) Appl. No.: 17/969,607

(22) Filed: Oct. 19, 2022

(65) Prior Publication Data

US 2023/0301147 A1 Sep. 21, 2023

(30) Foreign Application Priority Data

Mar. 16, 2022 (KR) ........................ 10-2022-0032950

(51) Int. Cl.
*H10K 59/131* (2023.01)
*H10K 59/80* (2023.01)

(52) U.S. Cl.
CPC ......... *H10K 59/131* (2023.02); *H10K 59/873* (2023.02)

(58) Field of Classification Search
CPC ............ H10K 77/111; H10K 2102/311; H10K 59/121; H10K 59/12
See application file for complete search history.

(56) References Cited

U.S. PATENT DOCUMENTS

| | | | | |
|---|---|---|---|---|
| 10,147,777 | B2 | 12/2018 | Lim et al. | |
| 11,195,898 | B2 | 12/2021 | Lee et al. | |
| 2019/0140025 | A1 | 5/2019 | Wang | |
| 2019/0229175 | A1* | 7/2019 | Lhee | H10K 71/191 |
| 2020/0091252 | A1* | 3/2020 | Bang | G06F 3/0412 |
| 2020/0243637 | A1 | 7/2020 | Lee et al. | |
| 2021/0118963 | A1 | 4/2021 | Bang et al. | |
| 2021/0134902 | A1 | 5/2021 | Lee et al. | |
| 2021/0175321 | A1 | 6/2021 | Chung et al. | |
| 2022/0208918 | A1* | 6/2022 | Cho | H10K 59/123 |

FOREIGN PATENT DOCUMENTS

| | | | |
|---|---|---|---|
| KR | 10-2018-0018960 | A | 2/2018 |
| KR | 10-2019-0130092 | A | 11/2019 |
| KR | 10-2020-0032291 | A | 3/2020 |
| KR | 10-2022-0097188 | A | 7/2022 |

* cited by examiner

*Primary Examiner* — Yuzhen Shen
(74) *Attorney, Agent, or Firm* — Womble Bond Dickinson (US) LLP

(57) ABSTRACT

A display device includes: a first light-emitting diode at a first display area; a second light-emitting diode at a second display area outside of the first display area; a plurality of sub-pixel circuits at the first display area; a driving circuit at the second display area, and to provide a scan signal to each of the plurality of sub-pixel circuits; a common voltage supply line at a non-display area outside of the second display area; and a common voltage electrode layer on the common voltage supply line, and electrically connected to the common voltage supply line. The second light-emitting diode, a portion of the common voltage electrode layer, and a portion of the driving circuit overlap with each other at the second display area.

17 Claims, 9 Drawing Sheets

DISPLAY DEVICE

CROSS-REFERENCE TO RELATED APPLICATION

This application claims priority to and the benefit of Korean Patent Application No. 10-2022-0032950, filed on Mar. 16, 2022, in the Korean Intellectual Property Office, the entire disclosure of which is incorporated by reference herein.

BACKGROUND

1. Field

Aspects of one or more embodiments of the present disclosure relate to a display device.

2. Description of the Related Art

In general, display devices may include a display area configured to provide an image, and a non-display area arranged outside of the display area. Recently, as the usage of display devices has diversified, a ratio of the display area has been increased, and a ratio of the non-display area has been reduced.

The above information disclosed in this Background section is for enhancement of understanding of the background of the present disclosure, and therefore, it may contain information that does not constitute prior art.

SUMMARY

As a non-display area is reduced, an area occupied by a power supply line arranged at (e.g., in or on) the non-display area is reduced, and thus, heat generation of the power supply line may increase.

One or more embodiments of the present disclosure are directed to a display device having a structure in which heat generation is reduced, and a display area is expanded.

However, the present disclosure is not limited to the above aspects and features, and the spirit and scope of the present disclosure is not limited thereto.

Additional aspects and features will be set forth, in part, in the description that follows, and in part, will be apparent from the description, or may be learned by practicing one or more of the presented embodiments of the present disclosure.

According to one or more embodiments of the present disclosure, a display device includes: a first light-emitting diode at a first display area; a second light-emitting diode at a second display area outside of the first display area; a plurality of sub-pixel circuits at the first display area; a driving circuit at the second display area, and configured to provide a scan signal to each of the plurality of sub-pixel circuits; a common voltage supply line at a non-display area outside of the second display area; and a common voltage electrode layer on the common voltage supply line, and electrically connected to the common voltage supply line. The second light-emitting diode, a portion of the common voltage electrode layer, and a portion of the driving circuit overlap with each other at the second display area.

In an embodiment, the common voltage electrode layer may cover at least a portion of the common voltage supply line, and at least a portion of the driving circuit.

In an embodiment, the second light-emitting diode may be electrically connected to one of the plurality of sub-pixel circuits through a connection line extending from the second display area toward the first display area.

In an embodiment, the common voltage electrode layer may include a first layer at a same layer as that of the connection line, the first layer including a same material as that of the connection line.

In an embodiment, the common voltage electrode layer may include a plurality of layers at different layers from one another.

In an embodiment, the common voltage electrode layer may include a metal layer or a transparent conductive material layer.

In an embodiment, the display device may further include a connection electrode layer on the common voltage electrode layer, and electrically connected to the common voltage electrode layer, and the connection electrode layer may be at a same layer as that of a first electrode of each of the first light-emitting diode and the second light-emitting diode.

In an embodiment, a second electrode of the first light-emitting diode and the second light-emitting diode may extend onto the connection electrode layer, and may directly contact an upper surface of the connection electrode layer to be electrically connected to the connection electrode layer.

In an embodiment, the display device may further include an encapsulation member covering the first light-emitting diode and the second light-emitting diode.

In an embodiment, the encapsulation member may include a thin-film encapsulation layer including at least one inorganic encapsulation layer and at least one organic encapsulation layer, and the driving circuit may overlap with the at least one inorganic encapsulation layer and the at least one organic encapsulation layer.

According to one or more embodiments of the present disclosure, a display device includes: a first light-emitting diode at a first display area; a plurality of sub-pixel circuits at the first display area; a driving circuit at a second display area, and configured to provide a scan signal to each of the plurality of sub-pixel circuits, the second display area being outside of the first display area; a second light-emitting diode at the second display area; a common voltage supply line at a non-display area outside of the second display area; and a common voltage electrode layer on the common voltage supply line, and electrically connected to the common voltage supply line. A portion of the common voltage electrode layer extends from the non-display area toward the second display area.

In an embodiment, the portion of the common voltage electrode layer may be located between the driving circuit and the second light-emitting diode in a cross-sectional view.

In an embodiment, the second light-emitting diode may be electrically connected to one of the plurality of sub-pixel circuits through a connection line extending from the second display area toward the first display area.

In an embodiment, the common voltage electrode layer may include a plurality of layers at different layers from one another.

In an embodiment, the common voltage electrode layer may include a metal layer or a transparent conductive material layer.

In an embodiment, the display device may further include a connection electrode layer on the common voltage electrode layer, and electrically connected to the common voltage electrode layer. The connection electrode layer may be at a same layer as that of a first electrode of each of the first light-emitting diode and the second light-emitting diode, and a second electrode of the first light-emitting diode and the second light-emitting diode may extend onto the connection electrode layer, and may directly contact an upper surface of the connection electrode layer to be electrically connected to the connection electrode layer.

In an embodiment, the common voltage electrode layer may cover at least a portion of the common voltage supply line and at least a portion of the driving circuit.

In an embodiment, the second light-emitting diode may overlap with the driving circuit at the second display area.

In an embodiment, the display device may further include an encapsulation member covering the first light-emitting diode and the second light-emitting diode.

In an embodiment, the encapsulation member may include a thin-film encapsulation layer including at least one inorganic encapsulation layer and at least one organic encapsulation layer, and the driving circuit may overlap with the at least one inorganic encapsulation layer and the at least one organic encapsulation layer.

The above and/or other aspects and features will become apparent and more readily appreciated from the following description of the embodiments, the accompanying drawings, and the claims.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1A:
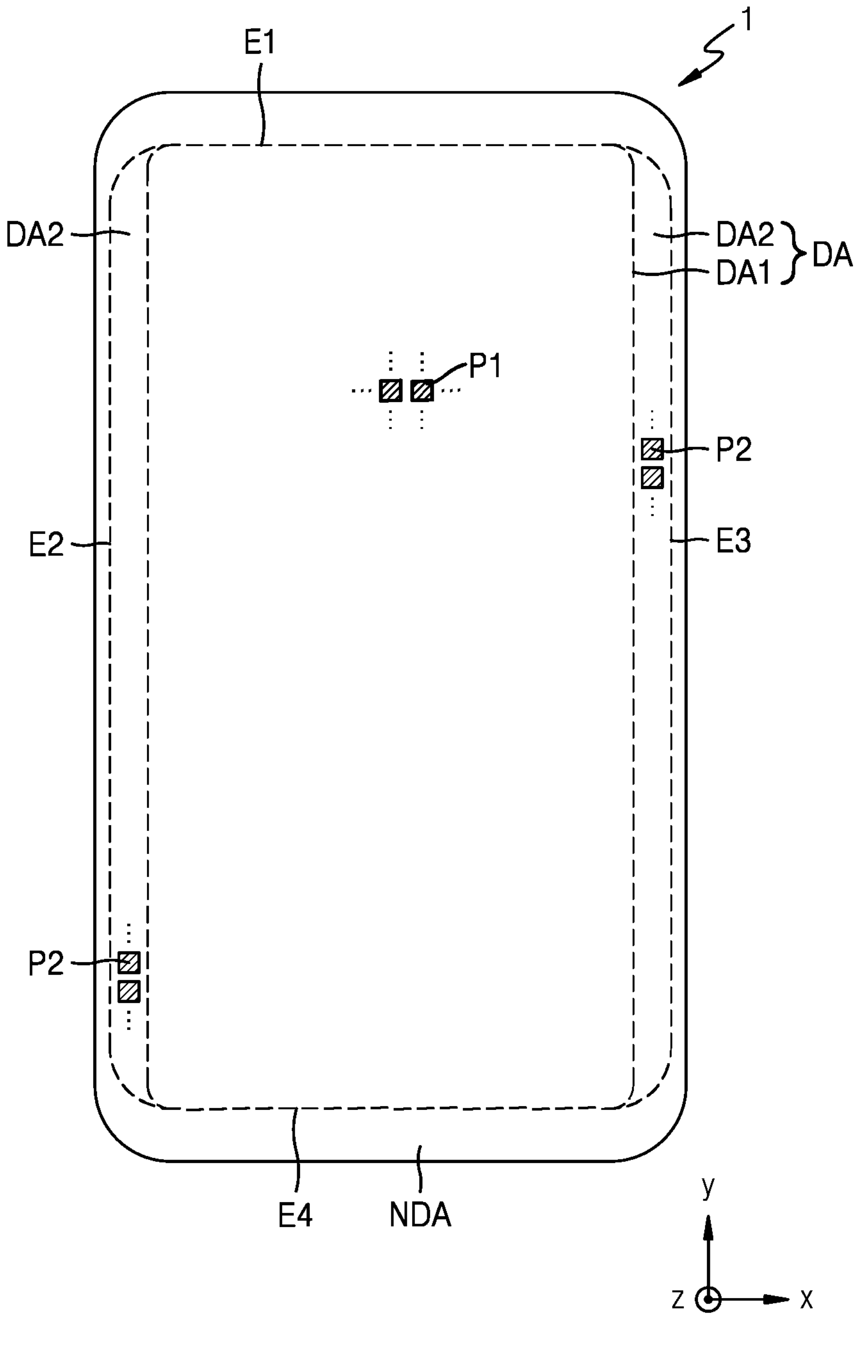
FIGS. 1A-1C are schematic plan views of a display device according to one or more embodiments.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense.

For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
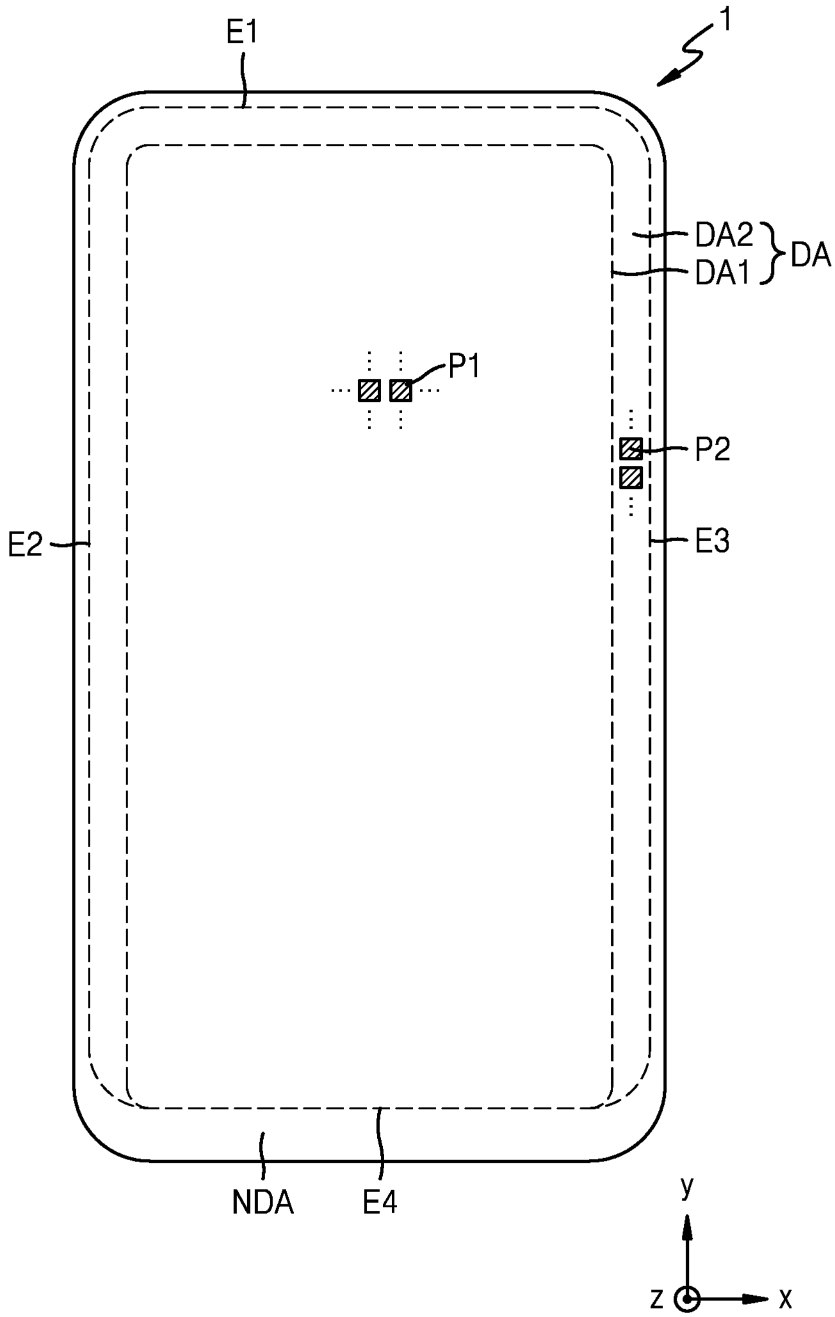
Figure 1C:
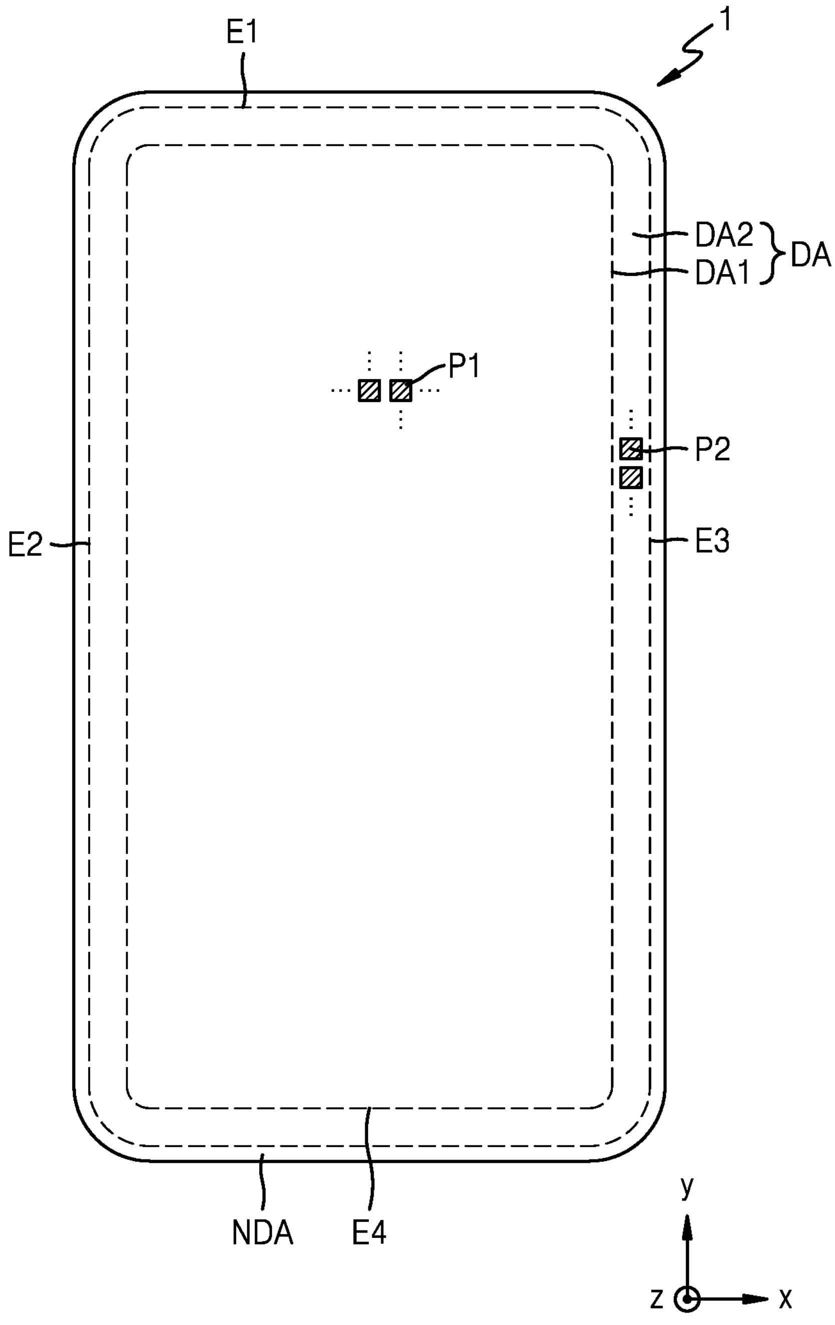

FIGS. 1A through 1C are schematic plan views of a display device 1 according to one or more embodiments.

Referring to FIGS. 1A to 1C, the display device 1 includes a display area DA, and a non-display area NDA outside of the display area DA. The display area DA is a portion in which an image is displayed. The display area DA may have a rectangular planar shape with a short side extending in an x-direction, and a long side extending in a y-direction. A corner where the short side extending in the x-direction meets the long side extending in the y-direction may be rounded with a suitable curvature (e.g., a predetermined or certain curvature), or may be right-angled. Accordingly, the display area DA may have a rectangular or substantially rectangular shape with rounded corners. In another embodiment, the display area DA may have various suitable shapes, such as a circular shape, an elliptical shape, another polygonal shape, and/or other particular shapes.

The display area DA may include a first display area DA1, and a second display area DA2 outside of the first display area DA1. The first display area DA1 may occupy most of the area of the display area DA.

As used herein, the phrase "the first display area DA1 occupies most of the area of the display area DA" may indicate that the first display area DA1 has an area exceeding about 50% of the total area of the display area DA. In some embodiments, the first display area DA1 may occupy about 80% or more of the area of the display area DA.

The second display area DA2 may occupy a relatively smaller area of the display area DA than that of the first display area DA1. The first display area DA1 may be arranged relatively inside of the display area DA, and the second display area DA2 may be arranged more to the outside than the first display area DA1. For example, the second display area DA2 may be arranged between a portion of the first display area DA1 and a portion of the non-display area NDA.

The second display area DA2 may at least partially surround (e.g., around a periphery of) the first display area DA1 outside the first display area DA1.

In some embodiments, as shown in FIG. 1A, the second display area DA2 may be arranged on opposite sides of the first display area DA1. In other words, the second display area DA2 may be arranged to correspond to a second edge E2 and a third edge E3 of the display area DA.

In another embodiment, as shown in FIG. 1B, the second display area DA2 may be arranged on opposite sides and an upper side of the first display area DA1. In other words, the second display area DA2 may be arranged to correspond to the second edge E2, the third edge E3, and a first edge E1 of the display area DA. The first edge E1 may cross the second edge E2 and the third edge E3, and may connect the second edge E2 to the third edge E3. In other words, the second display area DA2 may partially surround (e.g., around a periphery of) the first display area DA1, except for a fourth edge E4 of the display area DA.

In another embodiment, as shown in FIG. 1C, the second display area DA2 may be arranged on opposite sides, the upper side, and a lower side of the first display area DA1. In other words, the second display area DA2 may be arranged to correspond to the first edge E1, the second edge E2, the third edge E3, and the fourth edge E4 of the display area DA. The second display area DA2 may entirely surround (e.g., around a periphery of) the first display area DA1.

A plurality of sub-pixels may be arranged at (e.g., in or on) each of the first display area DA1 and the second display area DA2. For example, FIGS. 1A to 1C illustrate first sub-pixels P1 arranged at (e.g., in or on) the first display area DA1, and second sub-pixels P2 arranged at (e.g., in or on) the second display area DA2.

Each of the first sub-pixels P1 and the second sub-pixels P2 may emit light by using a light-emitting diode. The light-emitting diode may include an emission layer configured to emit red, green, or blue light. In an embodiment, an emission layer of the light-emitting diode may be an organic emission layer including an organic material, and thus, the light-emitting diode may be an organic light-emitting diode. In other embodiments, the emission layer may include an organic material, an inorganic material, quantum dots, an organic material and quantum dots, or an inorganic material and quantum dots.

The display device 1 may be an electronic apparatus for displaying a moving image and/or a still image. The display device 1 may be used in various suitable electronic devices including, for example, portable electronic devices, such as a mobile phone, a smartphone, a tablet personal computer (PC), a mobile communication terminal, an electronic notebook, an electronic book, a portable multimedia player (PMP), a navigation device, an ultra-mobile PC (UMPC), and the like, as well as other suitable devices, such as a television, a notebook computer, a monitor, a billboard, an Internet of things (IOT) device, and the like. In addition, the display device 1 according to an embodiment may be used in wearable devices, such as a smart watch, a watch phone, a glasses-type display, a head-mounted display (HMD), and the like. In addition, the display device 1 according to an embodiment may be used in a vehicle instrument panel, a center information display (CID) arranged on a center fascia or a dashboard of a vehicle, a room mirror display replacing a side mirror of a vehicle, an electronic device arranged on a rear side of a front seat as entertainment for a rear seat of a vehicle, and the like.

Figure 2:
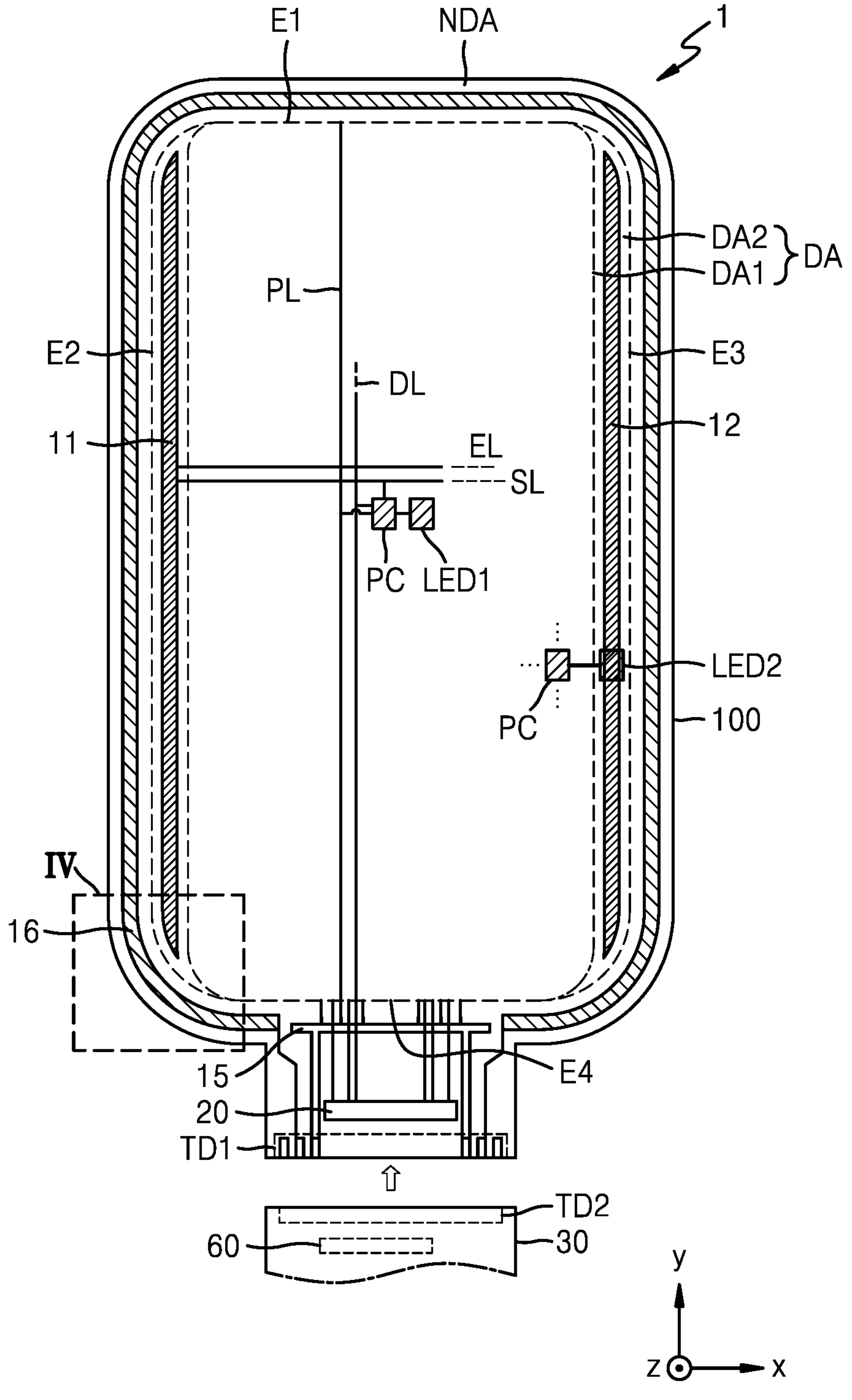
FIG. 2 is a schematic plan view of a display device according to an embodiment.

FIG. 2 is a schematic plan view of the display device 1 according to an embodiment. As described above with reference to FIGS. 1A to 1C, the display device 1 shown in FIG. 2 may include the first display area DA1, and the second display area DA2 that at least partially surrounds (e.g., around a periphery of) the first display area DA1. Hereinafter, for convenience, a case where the second display area DA2 is arranged on opposite sides of the first display area DA1, as shown in FIG. 1A, will be described in more detail.

Referring to FIG. 2, the display device 1 includes a substrate 100. Various suitable components constituting the display device 1 are disposed on the substrate 100. A shape of the display device 1 may be the same or substantially the same as a shape of the substrate 100. For example, it may be understood that the substrate 100 includes the display area DA and the non-display area NDA.

First light-emitting diodes LED1 may be arranged at (e.g., in or on) the first display area DA1 of the display area DA, and second light-emitting diodes LED2 may be arranged at (e.g., in or on) the second display area DA2 of the display area DA. The first light-emitting diodes LED1 and the second light-emitting diodes LED2 may be electrically connected to sub-pixel circuits PC arranged at (e.g., in or on) the first display area DA1, respectively. Emission areas of the first light-emitting diodes LED1 may respectively correspond to the first sub-pixels P1 described above with reference to FIGS. 1A to 1C, and emission areas of the second light-emitting diodes LED2 may respectively correspond to the second sub-pixels P2 described above with reference to FIGS. 1A to 1C.

Each sub-pixel circuit PC may include transistors connected to a signal line and/or a voltage line. For example, FIG. 2 shows a scan line SL, an emission control line EL, and a data line DL as signal lines electrically connected to the transistors, and shows a driving voltage line PL as a voltage line.

In an embodiment, some of the scan lines SL may be electrically connected to a first driving circuit 11, and others of the scan lines SL may be connected to a second driving circuit 12. The first and second driving circuits 11 and 12 include a scan driver configured to generate a scan signal, and a generated scan signal may be transferred to one transistor of the sub-pixel circuit PC through the scan line SL. The first driving circuit 11 and/or the second driving circuit 12 may include an emission control driver configured to generate an emission control signal. A generated emission control signal may be transferred to one transistor of the sub-pixel circuit PC through the emission control line EL.

The first driving circuit 11 and the second driving circuit 12 may be arranged on opposite sides of the first display area DA1, respectively. For example, the first driving circuit 11 may be arranged at (e.g., in or on) the second display area DA2 on the left side of the first display area DA1, and the second driving circuit 12 may be arranged at (e.g., in or on) the second display area DA2 on the right side of the first display area DA1.

The sub-pixel circuit PC is arranged at (e.g., in or on) the first display area DA1, and not at (e.g., in or on) the second display area DA2. The first light-emitting diodes LED1 of the first display area DA1 and the second light-emitting diodes LED2 of the second display area DA2 may be electrically connected to sub-pixel circuits PC arranged at (e.g., in or on) the first display area DA1, respectively. The second light-emitting diodes LED2 may be arranged to overlap with the first driving circuit 11 or the second driving circuit 12, and may be electrically connected to the sub-pixel circuits PC arranged at (e.g., in or on) the first display area DA1, respectively, to be turned on/off.

An integrated circuit 20 may include a data driving circuit configured to provide a data signal. The integrated circuit 20 may be configured to transfer a data signal to one transistor of the sub-pixel circuit PC through the data line DL.

A first terminal portion (e.g., a first terminal area) TD1 may be arranged on one side of the substrate 100. A printed circuit board 30 may be attached to the first terminal portion TD1. The printed circuit board 30 may include a second terminal portion (e.g., a second terminal area) TD2 electrically connected to the first terminal portion TD1, and a controller 60 may be disposed on the printed circuit board 30.

Control signals of the controller 60 may be provided to the first and second driving circuits 11 and 12, the integrated circuit 20, a driving voltage supply line 15, and a common voltage supply line 16 through the first and second terminal portions TD1 and TD2.

The driving voltage supply line 15 and the common voltage supply line 16 may be arranged at (e.g., in or on) the non-display area NDA. The driving voltage supply line 15 may be arranged at a location corresponding to the fourth edge E4 of the display area DA. The common voltage supply line 16 may extend in parallel or substantially in parallel with the second edge E2, the first edge E1, and the third edge E3 of the display area DA, and a portion of the common voltage supply line 16 corresponding to the fourth edge E4 of the display area DA may have an open loop shape.

Figure 3:
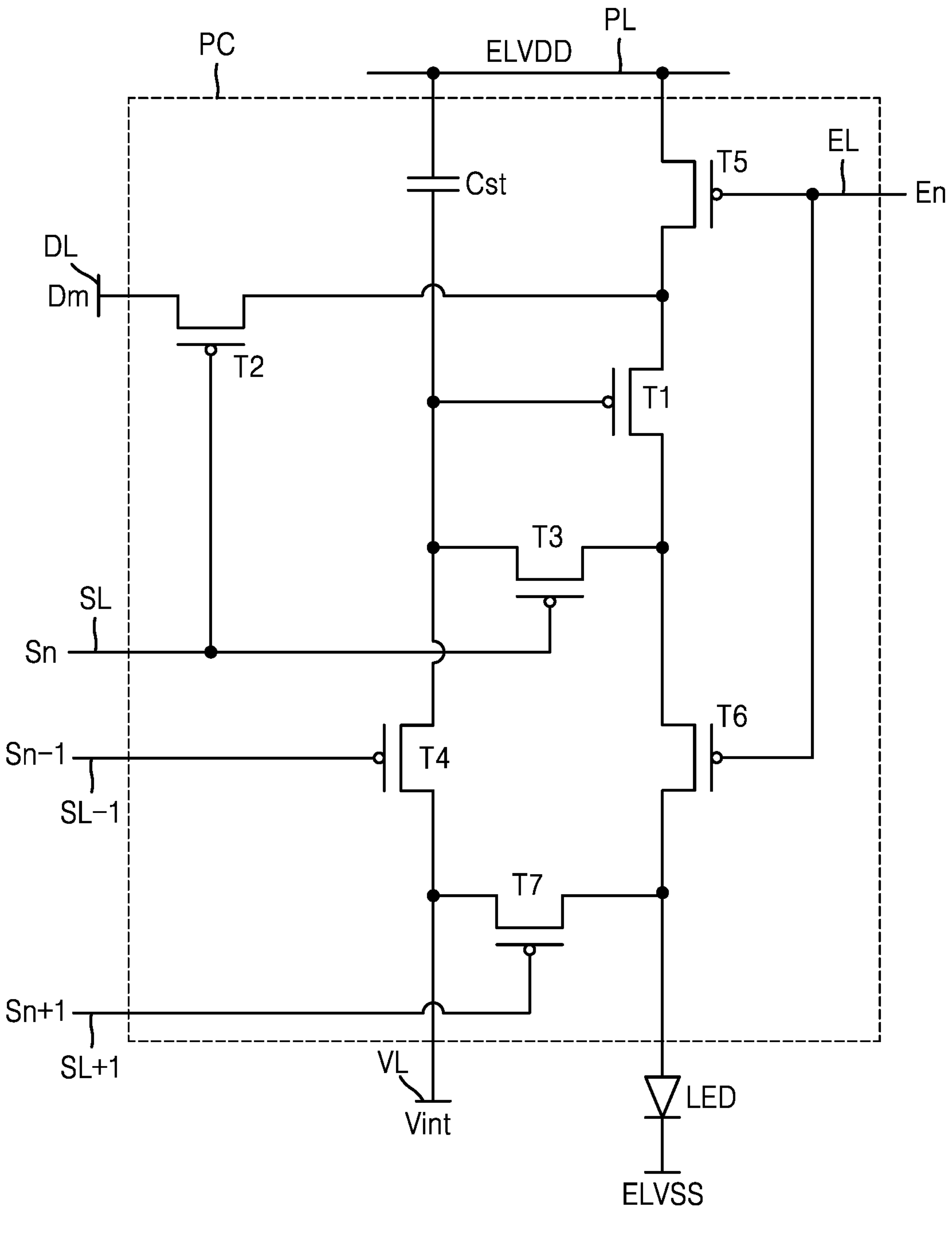
FIG. 3 is an equivalent circuit diagram of a sub-pixel circuit included in a display device according to an embodiment.

FIG. 3 is an equivalent circuit diagram of the sub-pixel circuit PC included in the display device 1 according to an embodiment.

Referring to FIG. 3, the sub-pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Although FIG. 3 shows that the sub-pixel circuit PC includes signal lines SL, SL−1, SL+1, EL, and DL, an initialization voltage line VL, and a driving voltage line PL, the present disclosure is not limited thereto. In another embodiment, at least one of the signal lines SL, SL−1, SL+1, EL, and DL, and/or the initialization voltage line VL may be shared by adjacent sub-pixel circuits.

A drain electrode of the driving thin-film transistor T1 may be electrically connected to a light-emitting diode LED through the emission control thin-film transistor T6. The driving thin-film transistor T1 is configured to receive a data signal Dm according to a switching operation of the switching thin-film transistor T2, and supply a driving current to the light-emitting diode LED.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1, and may be connected to the driving voltage line PL through the operation control thin-film transistor T5.

The switching thin-film transistor T2 is turned on according to a scan signal Sn transferred through the scan line SL, and is configured to perform a switching operation of transferring a data signal Dm transferred through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1, and may be connected to a first electrode of the light-emitting diode LED through the emission control thin-film transistor T6. A drain electrode of the compensation thin-film transistor T3 may be connected to one electrode of a storage capacitor Cst, a source electrode of the first initialization thin-film transistor T4, and a gate electrode of the driving thin-film transistor T1. The compensation thin-film transistor T3 is turned on according to the scan signal Sn transferred through the scan line SL, and is configured to diode-connect the driving thin-film transistor T1 by connecting the gate electrode of the driving thin-film transistor T1 to the drain electrode of the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to the one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 transferred through the previous scan line SL−1, and may be configured to perform an initialization operation of initializing a voltage of the gate electrode of the driving thin-film transistor T1 by transferring an initialization voltage Vint to the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the first electrode of the light-emitting diode LED. The operation control thin-film transistor T5 and the emission control thin-film transistor T6 are concurrently (e.g., simultaneously) turned on according to an emission control signal En transferred through the emission control line EL, so that a driving voltage ELVDD is transferred to the light-emitting diode LED, and a driving current flows in the light-emitting diode LED.

A gate electrode of the second initialization thin-film transistor T7 may be connected to a next scan line SL+1. A source electrode of the second initialization thin-film transistor T7 may be connected to the first electrode of the light-emitting diode LED. A drain electrode of the second initialization thin-film transistor T7 may be connected to the initialization voltage line VL. The second initialization thin-film transistor T7 may be turned on according to a next scan signal Sn+1 transferred through the next scan line SL+1, and may be configured to initialize the first electrode of the light-emitting diode LED.

Although FIG. 3 shows that the first initialization thin-film transistor T4 and the second initialization thin-film transistor T7 are connected to the previous scan line SL−1 and the next scan line SL+1, respectively, the present disclosure is not limited thereto. In another embodiment, the first initialization thin-film transistor T4 and the second initialization thin-film transistor T7 may both be connected to the previous scan line SL−1, and driven according to the previous scan signal Sn−1.

The other electrode of the storage capacitor Cst may be connected to the driving voltage line PL. The one electrode of the storage capacitor Cst may be connected to the gate electrode of the driving thin-film transistor T1, the drain electrode of the compensation thin-film transistor T3, and the source electrode of the first initialization thin-film transistor T4.

A second electrode (e.g., a cathode) of the light-emitting diode LED is configured to receive a common voltage ELVSS. The light-emitting diode LED is configured to receive the driving current from the driving thin-film transistor T1 to emit light.

The sub-pixel circuit PC is not limited to the number of thin-film transistors, the number of storage capacitors, and the circuit design described above with reference to FIG. 3, and may be variously modified as needed or desired.

In some embodiments, a plurality of thin-film transistors, for example, the thin-film transistors T1 to T7, may be p-channel metal-oxide-semiconductor field-effect transistors (MOSFETs). In another embodiment, some of the plurality of thin-film transistors T1 to T7 may be n-channel MOSFETs, and other ones may be p-channel MOSFETs. For example, from among the plurality of thin-film transistors T1 to T7, the compensation thin-film transistor T3 and the first initialization thin-film transistor T4 may be NMOSFETs, and the other ones may be PMOSFETs. In some embodiments, from among the plurality of thin-film transistors T1 to T7, the compensation thin-film transistor T3, the first initialization thin-film transistor T4, and the second initialization thin-film transistor T7 may be NMOSFETs, and the other ones may be PMOSFETs. In some embodiments, the plurality of thin-film transistors T1 to T7 may all be NMOSFETs.

Each of the plurality of thin-film transistors T1 to T7 may include amorphous silicon or polysilicon. If desired, a thin-film transistor that is an NMOSFET may include an oxide semiconductor.

Figure 4:
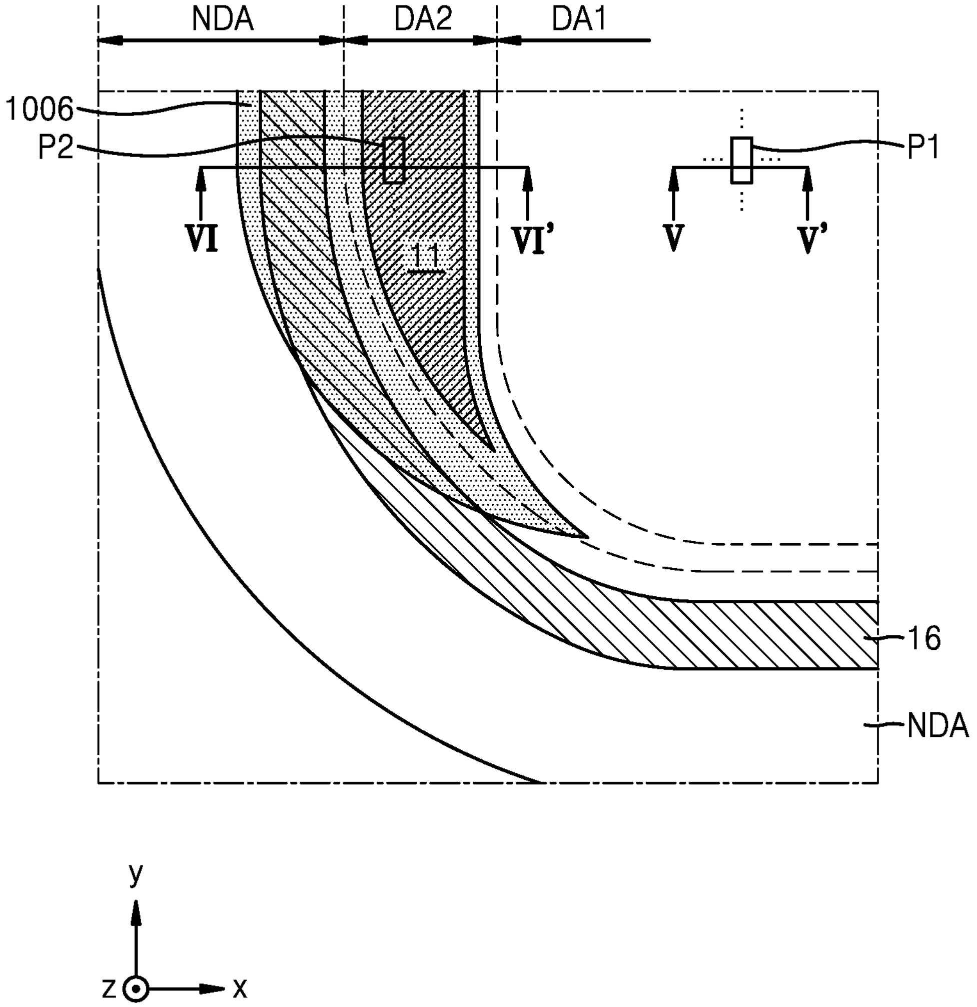
FIG. 4 is an enlarged plan view of the region IV of the display device shown in FIG. 2 according to an embodiment.

FIG. 4 is an enlarged plan view of the region IV of the display device 1 shown in FIG. 2 according to an embodiment.

Referring to FIG. 4, the first sub-pixels P1 may be arranged at (e.g., in or on) the first display area DA1. In other words, light-emitting diodes corresponding to the first sub-pixels P1, respectively, may be arranged at (e.g., in or on) the first display area DA1. The second sub-pixels P2 may be arranged at (e.g., in or on) the second display area DA2 outside of the first display area DA1. In other words, light-emitting diodes corresponding to the second sub-pixels P2, respectively, may be arranged at (e.g., in or on) the second display area DA2. The second sub-pixels P2 may be arranged to overlap with the first driving circuit 11 at (e.g., in or on) the second display area DA2. For example, the light-emitting diodes corresponding to the second sub-pixels P2, respectively, may be arranged to overlap with the first driving circuit 11.

The common voltage supply line 16 may be arranged outside of the second display area DA2. The common voltage supply line 16 may be arranged outside of the first driving circuit 11. A common voltage electrode layer 1006 may be disposed on the common voltage supply line 16. The common voltage electrode layer 1006 may have a size (e.g., an area) suitable to overlap with the common voltage supply line 16 and the first driving circuit 11. The common voltage electrode layer 1006 may be connected to the common voltage supply line 16 at (e.g., in or on) the non-display area NDA.

Figure 5:
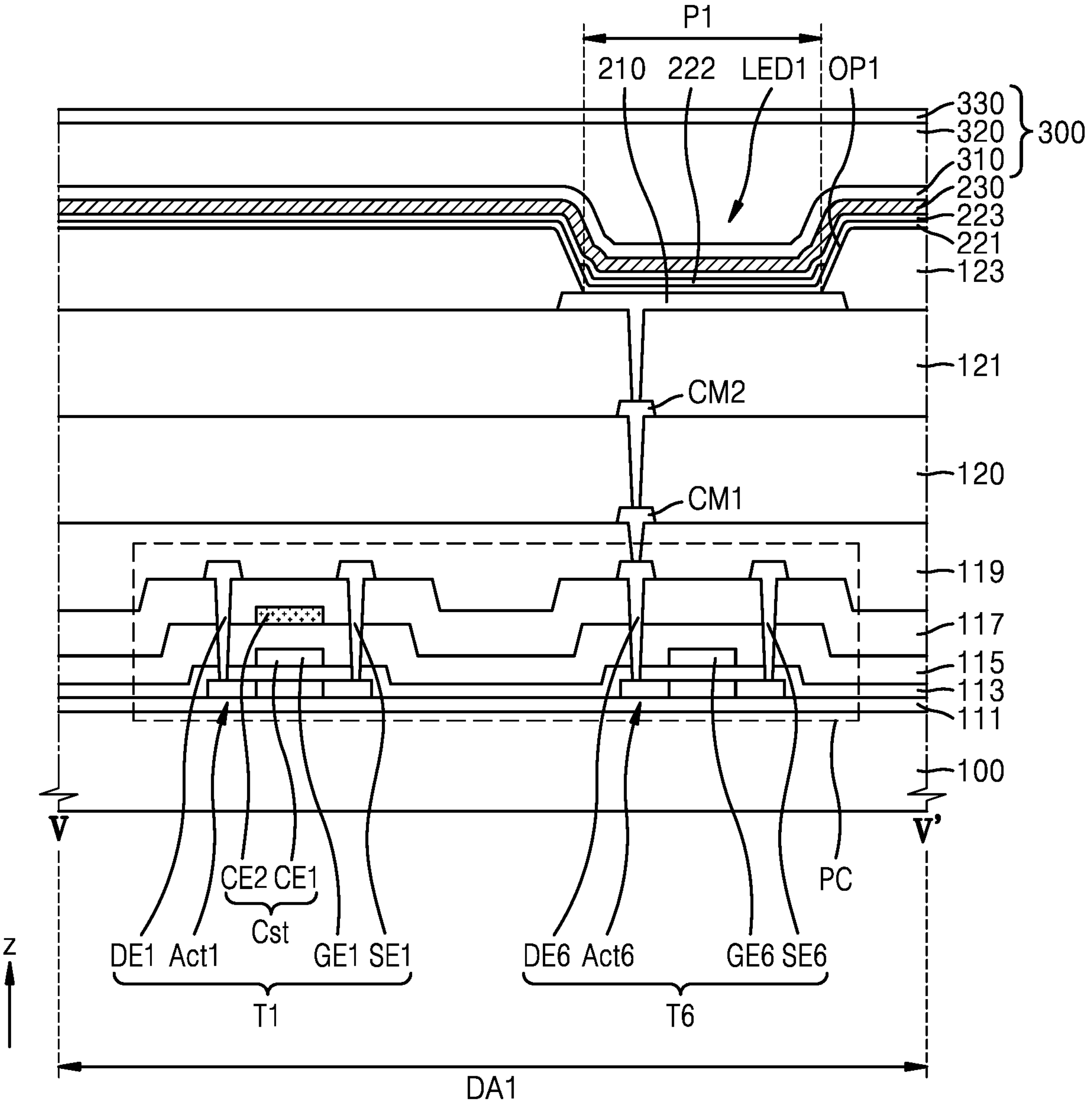
FIG. 5 is a cross-sectional view of the display device taken along the line V-V of FIG. 4.

FIG. 5 is a cross-sectional view of the display device 1 taken along the line V-V of FIG. 4.

Referring to FIG. 5, the first light-emitting diode LED1 corresponding to the first sub-pixel P1 may be arranged at (e.g., in or on) the first display area DA1. The sub-pixel circuit PC may be arranged between the substrate 100 and the first light-emitting diode LED1.

The substrate 100 may include an insulating material, such as glass, quartz, or polymer resin. The substrate 100 may be a rigid substrate, or a flexible substrate that is bendable, foldable, and/or rollable.

A buffer layer 111 may be disposed on the substrate 100 to prevent or substantially prevent foreign materials and/or moisture from below the substrate 100 from penetrating a thin-film transistor (e.g., T1 and T6), and may provide a flat or substantially flat surface on the substrate 100. The buffer layer 111 may include an inorganic material, such as an oxide or a nitride, an organic material, or an organic/inorganic composite material. The buffer layer 11 may have a single-layer structure, or a multi-layered structure including the inorganic material and the organic material. In some embodiments, a barrier layer may be further included between the substrate 100 and the buffer layer 111, the barrier layer blocking the penetration of external air. In some embodiments, the buffer layer 111 may include silicon oxide, silicon oxynitride, or silicon nitride.

The sub-pixel circuit PC may be disposed on the buffer layer 111. The sub-pixel circuit PC may include the transistors and the storage capacitor described above with reference to FIG. 3. For example, for convenience of illustration, FIG. 5 shows the driving thin-film transistor T1, the storage capacitor Cst, and the emission control thin-film transistor T6 of the sub-pixel circuit PC. The driving thin-film transistor T1 may include a driving semiconductor layer Act1, a driving gate electrode GE1, a driving source electrode SE1, and a driving drain electrode DE1. The emission control thin-film transistor T6 may include an emission control semiconductor layer Act6, an emission control gate electrode GE6, an emission control source electrode SE6, and an emission control drain electrode DE6.

The driving semiconductor layer Act1 and the emission control semiconductor layer Act6 may be disposed on the buffer layer 111, and may include polysilicon. In another embodiment, the driving semiconductor layer Act1 and the emission control semiconductor layer Act6 may include amorphous silicon. In another embodiment, the driving semiconductor layer Act1 and the emission control semiconductor layer Act6 may include at least one material selected from the group including (e.g., consisting of) indium (In), gallium (Ga), tin (Sn), zirconium (Zr), vanadium (V), hafnium (Hf), cadmium (Cd), germanium (Ge), chromium (Cr), titanium (Ti), and Zinc (Zn). The driving semiconductor layer Act1 and the emission control semiconductor layer Act6 may each include a channel area, a source area, and a drain area. The source area and the drain area may be doped with impurities.

A gate insulating layer 113 may be disposed on a semiconductor layer, for example, the driving semiconductor layer Act1 and the emission control semiconductor layer Act6. The gate insulating layer 113 may include an inorganic insulating material, such as silicon oxide, silicon nitride, and/or silicon oxynitride. The gate insulating layer 113 may include a single layer or multi-layers including one or more of the above-described inorganic insulating materials.

The driving gate electrode GE1 and the emission control gate electrode GE6 are disposed on the gate insulating layer 113 to overlap with the driving semiconductor layer Act1 and the emission control semiconductor layer Act6, respectively. The driving gate electrode GE1 and the emission control gate electrode GE6 may include molybdenum (Mo), aluminum (Al), copper (Cu), titanium (Ti), and/or the like, and may have a single-layer structure or a multi-layered structure.

A first interlayer insulating layer 115 may be disposed on a gate electrode, for example, the driving gate electrode GE1 and the emission control gate electrode GE6. The first interlayer insulating layer 115 may include an inorganic insulating material, such as silicon oxide, silicon nitride, and/or silicon oxynitride. The first interlayer insulating layer 115 may include a single layer or multi-layers including one or more of the above-described inorganic insulating materials.

An upper electrode CE2 of the storage capacitor Cst may be disposed on the first interlayer insulating layer 115. The upper electrode CE2 of the storage capacitor Cst may overlap with a lower electrode CE1 therebelow. The lower electrode CE1 of the storage capacitor Cst may include (e.g., may be the same as or may correspond to) the driving gate electrode GE1.

The upper electrode CE2 of the storage capacitor Cst may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and may include a single layer or multi-layers including one or more of the above-described materials.

A second interlayer insulating layer 117 may be disposed on the upper electrode CE2. The second interlayer insulating layer 117 may include an inorganic insulating material, such as silicon oxide, silicon nitride, or silicon oxynitride. The second interlayer insulating layer 117 may include a single layer or multi-layers including one or more of the above-described inorganic insulating materials.

The driving source electrode SE1, the driving drain electrode DE1, the emission control source electrode SE6, and the emission control drain electrode DE6 may be disposed on the second interlayer insulating layer 117. The driving source electrode SE1, the driving drain electrode DE1, the emission control source electrode SE6, and the emission control drain electrode DE6 may include a conductive material including molybdenum (Mo), aluminum (Al), copper (Cu), titanium (Ti), and/or the like, and may include a single layer or multi-layers including one or more of the above-described materials. For example, the driving source electrode SE1, the driving drain electrode DE1, the emission control source electrode SE6, and the emission control drain electrode DE6 may have a multi-layered structure of Ti/Al/Ti.

A first organic insulating layer 119 may be disposed on the driving source electrode SE1, the driving drain electrode DE1, the emission control source electrode SE6, and the emission control drain electrode DE6. The first organic insulating layer 119 may include an organic insulating material, such as a photosensitive polyimide or a siloxane-based organic material.

A first contact metal CM1 may be disposed on the first organic insulating layer 119, and electrically connected to the sub-pixel circuit PC. The first contact metal CM1 may include a metal material including molybdenum (Mo), aluminum (Al), copper (Cu), titanium (Ti), and/or the like, and may include a single layer or multi-layers including one or more of the above-described materials.

A second organic insulating layer 120 may be disposed on the first contact metal CM1. The second organic insulating layer 120 may include an organic insulating material, such as a photosensitive polyimide or a siloxane-based organic material. A second contact metal CM2 may be disposed on the second organic insulating layer 120. The second contact metal CM2 may contact the first contact metal CM1. The second contact metal CM2 may include a metal material including molybdenum (Mo), aluminum (Al), copper (Cu), titanium (Ti), and/or the like, and may include a single layer or multi-layers including one or more of the above-described materials.

A third organic insulating layer 121 may be disposed on the second organic insulating layer 120. The third organic insulating layer 121 may include an organic insulating material, such as a photosensitive polyimide or a siloxane-based organic material.

The first light-emitting diode LED1 may be disposed on the third organic insulating layer 121. A first electrode 210 of the first light-emitting diode LED1 may be connected to the second contact metal CM2 through a via hole of (e.g., penetrating) the third organic insulating layer 121. The first electrode 210 may be electrically connected to the sub-pixel circuit PC through the second contact metal CM2 and the first contact metal CM1. In some embodiments, one of the second contact metal CM2 and the first contact metal CM1 may be omitted. In another embodiment, another conductive layer may be included above the second contact metal CM2, or another conductive layer may be included between the first contact metal CM1 and the second contact metal CM2.

The first light-emitting diode LED1 may include the first electrode 210, an emission layer 222, and a second electrode 230, and may further include a functional layer between the first electrode 210 and the second electrode 230.

The first electrode 210 of the first light-emitting diode LED1 may include a conductive oxide, such as indium tin oxide (ITO), indium zinc oxide (IZO), zinc oxide (ZnO), indium oxide (In203), indium gallium oxide (IGO), indium zinc gallium oxide (IZGO), and/or aluminum zinc oxide (AZO). The first electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a suitable compound thereof. For example, the first electrode 210 may have a structure having layers including ITO, IZO, ZnO, or $In_2O_3$ above/below the reflective layer. The first electrode 210 may have a stacked structure of ITO/Ag/ITO.

A bank layer 123 may be disposed on the first electrode 210, and may cover an edge of the first electrode 210. The bank layer 123 may include a first opening OP1 exposing a central portion of the first electrode 210. The first opening OP1 of the bank layer 123 may define the emission area of the first light-emitting diode LED1, or in other words, the first sub-pixel P1. In other words, the size and shape of the first sub-pixel P1 may be defined by the size and shape of the first opening OP1.

The bank layer 123 may include an organic insulating material, such as polyimide, polyimide, acrylic resin, benzocyclobutene, hexamethyldisiloxane (HMDSO), or phenolic resin.

The emission layer 222 may be arranged over the bank layer 123. The emission layer 222 may include a polymer material or a low molecular weight material, and may be configured to emit red, green, or blue light. First and second functional layers 221 and 223 may be disposed under or over the emission layer 222. The first functional layer 221 may include a hole transport layer (HTL) and/or a hole injection layer (HIL). The second functional layer 223 may include an electron transport layer (ETL) and/or an electron injection layer (EIL). Unlike the emission layer 222, each of the first and second functional layers 221 and 223 may cover an entirety or substantially an entirety of the display area DA.

The second electrode 230 may include a conductive material having a low work function. Unlike the emission layer 222, the second electrode 230 may cover an entirety or substantially an entirety of the display area DA. The second electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or a suitable alloy thereof. In some embodiments, the second electrode 230 may further include a layer including ITO, IZO, ZnO, or $In_2O_3$ on the (semi-)transparent layer including one or more of the above-described materials.

The first light-emitting diode LED1 may be covered by an encapsulation member. In an embodiment, FIG. 5 shows that the encapsulation member is a thin-film encapsulation layer 300 including at least one inorganic encapsulation layer and at least one organic encapsulation layer. In an embodiment, the thin-film encapsulation layer 300 may include a first inorganic encapsulation layer 310, a second inorganic encapsulation layer 330, and an organic encapsulation layer 320 therebetween. In another embodiment, the encapsulation member may include an encapsulation substrate arranged at a suitable distance (e.g., a predetermined or certain distance) spaced apart from an upper surface of the second electrode 230 of the first light-emitting diode LED1, and facing the substrate 100.

The first inorganic encapsulation layer 310 and the second inorganic encapsulation layer 330 may include at least one inorganic insulating material, such as silicon oxide, silicon oxynitride, and/or silicon nitride. The organic encapsulation layer 320 may include a polymer-based material. The polymer-based material may include silicon-based resin, acryl-based resin, epoxy-based resin, polyimide, and/or polyethylene. The first inorganic encapsulation layer 310, the organic encapsulation layer 320, and the second inorganic encapsulation layer 330 may cover an entirety or substantially an entirety of the first display area DA1.

Figure 6:
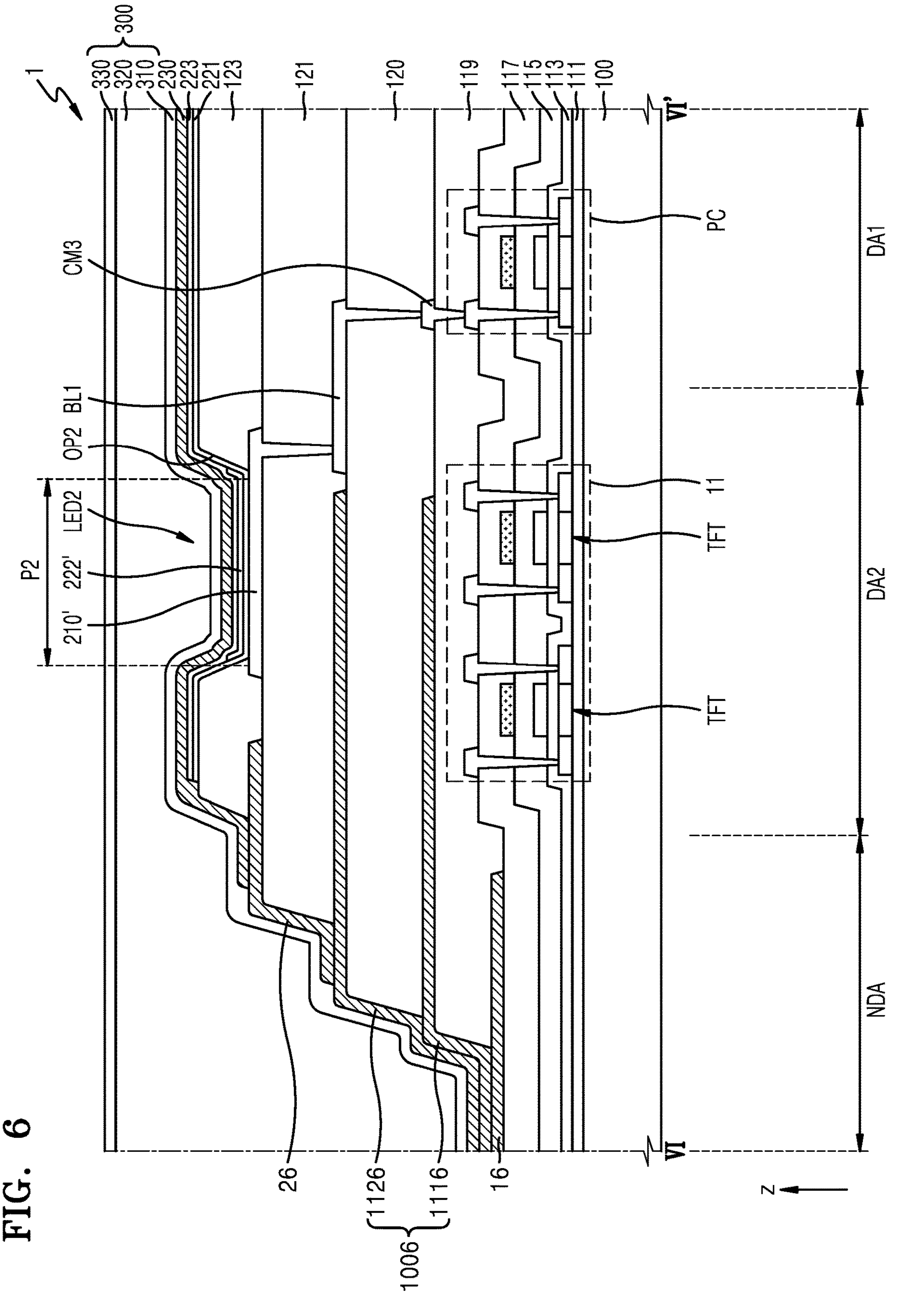
FIG. 6 is a cross-sectional view of the display device taken along the line VI-VI' of FIG. 4.

FIG. 6 is a cross-sectional view of the display device 1 taken along the line VI-VI' of FIG. 4.

Referring to FIG. 6, the second light-emitting diode LED2 corresponding to the second sub-pixel P2 may be arranged at (e.g., in or on) the second display area DA2. The second light-emitting diode LED2 may include a first electrode 210', the second electrode 230, and an emission layer 222' between the first electrode 210' and the second electrode 230. A structure of the second light-emitting diode LED2 may be the same or substantially the same as that of the first light-emitting diode LED1 described above with reference to FIG. 5. The bank layer 123 may include a second opening OP2 overlapping with the first electrode 210' of the second light-emitting diode LED2. The emission layer 222' may overlap with the first electrode 210' through the second opening OP2 of the bank layer 123. The first and second functional layers 221 and 223 and the second electrode 230 may be formed over the substrate 100 to cover an entirety or substantially an entirety of the first display area DA1 and the second display area DA2.

The second opening OP2 of the bank layer 123 may define the emission area of the second light-emitting diode LED2, or in other words, the second sub-pixel P2. In other words, the size and shape of the second sub-pixel P2 may be defined by the size and shape of the second opening OP2.

The second light-emitting diode LED2 may be covered by the thin-film encapsulation layer 300. For example, the thin-film encapsulation layer 300 may include the first inorganic encapsulation layer 310, the second inorganic encapsulation layer 330, and the organic encapsulation layer 320 therebetween. Each of the first inorganic encapsulation layer 310, the organic encapsulation layer 320, and the second inorganic encapsulation layer 330 may cover an entirety or substantially an entirety of the first display area DA1 and the second display area DA2.

Although FIG. 6 shows that the thin-film encapsulation layer 300 encapsulates the second light-emitting diode LED2, the present disclosure is not limited thereto. In another embodiment, instead of the thin-film encapsulation layer 300, an encapsulation substrate may encapsulate the second light-emitting diode LED2. The encapsulation substrate may be arranged to face the substrate 100, and may be spaced apart from the second electrode 230 of the second light-emitting diode LED2 by a suitable distance (e.g., a predetermined or certain distance). The encapsulation substrate may be arranged parallel to or substantially parallel to the substrate 100.

The second light-emitting diode LED2 and/or the second sub-pixel P2 may be disposed over the first driving circuit 11, and may overlap with the first driving circuit 11. The first driving circuit 11 may include a scan driver configured to provide a scan signal as described above with reference to FIG. 1, and the scan driver may include at least one thin-film transistor TFT.

The second light-emitting diode LED2 may be electrically connected to the sub-pixel circuit PC arranged at (e.g., in or on) the first display area DA1. In an embodiment, FIG. 6 shows that the second light-emitting diode LED2 is electrically connected to the sub-pixel circuit PC arranged at (e.g., in or on) the first display area DA1 through a connection line BL1. The connection line BL1 may be arranged between the second light-emitting diode LED2 and the sub-pixel circuit PC, and may extend from the second display area DA2 toward the first display area DA1 (or from the first display area DA1 toward the second display area DA2).

In some embodiments, the connection line BL1 may be connected to the sub-pixel circuit PC through a third contact metal CM3. Although FIG. 6 shows that the connection line BL1 is disposed on the second organic insulating layer 120, in another embodiment, the connection line BL1 may be disposed under (e.g., underneath) or over the first organic insulating layer 119.

The connection line BL1 may include a metal layer or a transparent conductive material layer. For example, the connection line BL1 may include a metal layer including molybdenum (Mo), aluminum (Al), copper (Cu), titanium (Ti), and/or the like, and the metal layer may include a single layer or multi-layers including one or more of the above-described materials. In some embodiments, the connection line BL1 may include a transparent conductive material layer including a suitable material, such as ITO, IZO, ZnO, or $In_2O_3$.

The common voltage supply line 16 may be arranged at (e.g., in or on) the non-display area NDA. In an embodiment, the common voltage supply line 16 may be disposed on the second interlayer insulating layer 117. The common voltage supply line 16 may include molybdenum (Mo), aluminum (Al), copper (Cu), titanium (Ti), and/or the like, and may include a single layer or multi-layers. For example, the common voltage supply line 16 may have a three-layered structure of Ti/Al/Ti.

The common voltage electrode layer 1006 may be disposed over the non-display area NDA and the second display area DA2. The common voltage electrode layer 1006 may overlap with the common voltage supply line 16 and the first driving circuit 11. For example, the common voltage electrode layer 1006 may cover at least a portion of the common voltage supply line 16, and may cover at least a portion of the first driving circuit 11.

The common voltage electrode layer 1006 may be connected to the common voltage supply line 16 at (e.g., in or on) the non-display area NDA. The common voltage electrode layer 1006 may include at least one conductive material layer. In some embodiments, the common voltage electrode layer 1006 may include a plurality of sub-layers arranged on different insulating layers from one another, and including a conductive material. For example, as shown in FIG. 6, the common voltage electrode layer 1006 may include a first sub-layer 1116 on the first organic insulating layer 119, and a second sub-layer 1126 on the second organic insulating layer 120. Although FIG. 6 shows that the common voltage electrode layer 1006 includes two sub-layers, the present disclosure is not limited thereto. In another embodiment, when a conductive layer is further included between a connection electrode layer 26 and the second sub-layer 1126, the common voltage electrode layer 1006 may include three or more sub-layers.

The first sub-layer 1116 may extend onto the common voltage supply line 16 past a side surface of the first organic insulating layer 119, and may contact the common voltage supply line 16 to be electrically connected thereto. The second sub-layer 1126 may extend onto the first sub-layer 1116 past a side surface of the second organic insulating layer 120, and may contact the first sub-layer 1116 to be electrically connected thereto.

The first sub-layer 1116 and/or the second sub-layer 1126 may include a metal layer or a transparent conductive material layer. For example, the first sub-layer 1116 and/or the second sub-layer 1126 may be a metal layer including molybdenum (Mo), aluminum (Al), copper (Cu), titanium (Ti), and/or the like, and may include a single layer or multi-layers including one or more of the above-described materials. In some embodiments, the first sub-layer 1116 and/or the second sub-layer 1126 may include a transparent conductive material, such as ITO, IZO, ZnO, or $In_2O_3$. The first sub-layer 1116 and the second sub-layer 1126 may include the same material as each other or different materials from each other.

The common voltage electrode layer 1006 may be electrically connected to the connection electrode layer 26 disposed on the common voltage electrode layer 1006. The connection electrode layer 26 may be arranged at (e.g., in or on) the same layer as that of the first electrode 210', and may include the same material as that of the first electrode 210'.

The second electrode 230 may extend onto the connection electrode layer 26 past a side surface of the bank layer 123, and may contact the connection electrode layer 26 to be electrically connected thereto. The connection electrode layer 26 may extend onto the common voltage electrode layer 1006 past a side surface of the third organic insulating layer 121, and may contact the common voltage electrode layer 1006 to be electrically connected thereto.

In a comparative example, the common voltage electrode layer 1006 is omitted, and the common voltage supply line 16 is connected to the second electrode 230 through the connection electrode layer 26. In this case, an area occupied by the common voltage supply line 16 on the substrate 100 may be reduced, and thus, heat generation in the common voltage supply line 16 may significantly increase. The increase in the heat generation in the common voltage supply line 16 may be further intensified as the non-display area NDA of a display device becomes narrower.

However, according to one or more embodiments of the present disclosure, because the common voltage electrode layer 1006 is electrically connected to the common voltage supply line 16, the heat generation in the common voltage supply line 16 may be significantly reduced or prevented. For example, because the common voltage electrode layer 1006 extends from the non-display area NDA toward the second display area DA2, the above-described heat generation may be reduced or prevented without increasing the non-display area NDA. In other words, it may be possible to prevent or substantially prevent the heat generation of the common voltage supply line 16, while reducing the non-display area NDA.

Because the common voltage electrode layer 1006 having a constant or substantially constant voltage level at least partially covers the first driving circuit 11, static electricity may be prevented or substantially prevented from flowing into the first driving circuit 11 during or after the manufacture of a display device.

Figure 7:
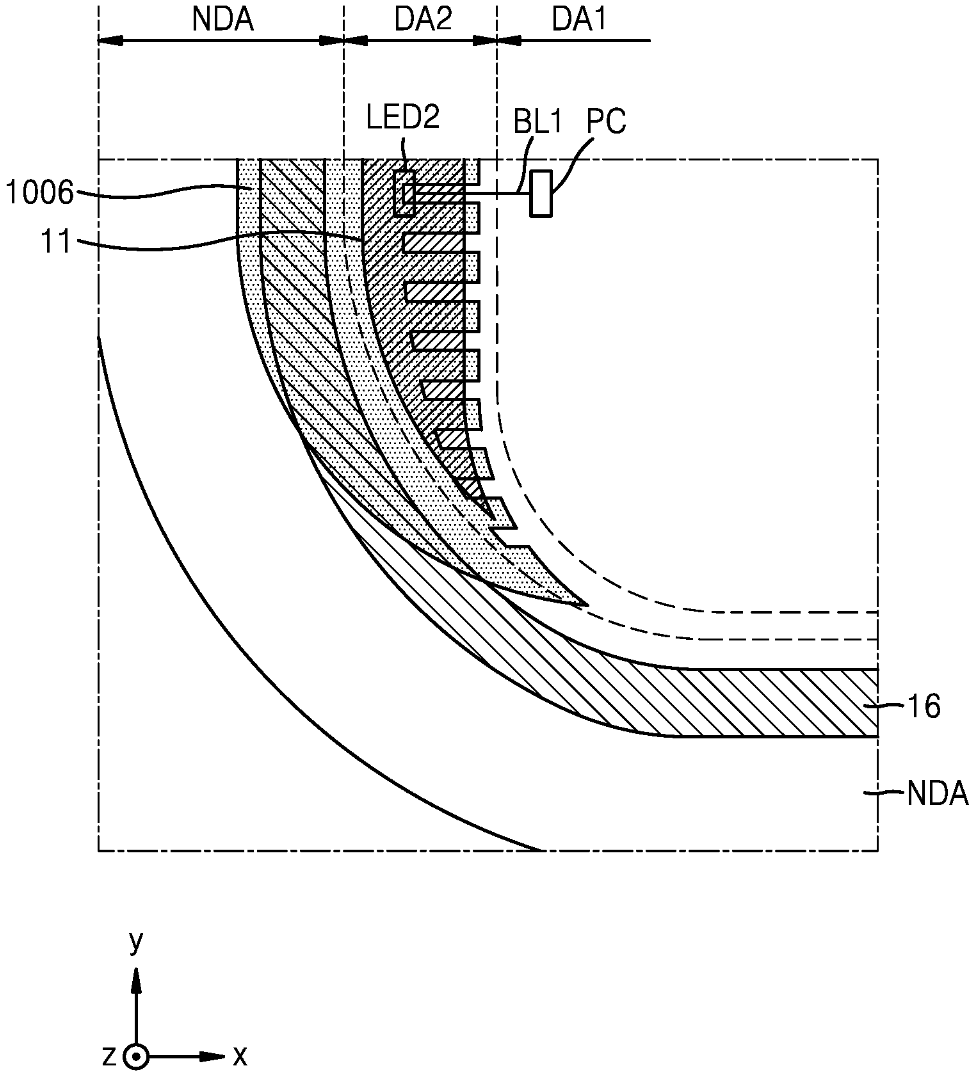
FIG. 7 is an enlarged plan view of a portion of a display device according to another embodiment.

FIG. 7 is an enlarged plan view of a portion of a display device according to another embodiment.

As described above, according to one or more embodiments of the present disclosure, the common voltage electrode layer 1006 may cover at least a portion of the first driving circuit 11 and at least a portion of the common voltage supply line 16. FIG. 7 shows that the common voltage electrode layer 1006 covers a portion of the first driving circuit 11 and a portion of the common voltage supply line 16 according to another embodiment.

In some embodiments, when the common voltage electrode layer 1006 includes a layer that is arranged at (e.g., in or on) the same layer as that of the connection line BL1, and includes the same material as that of the connection line BL1, the common voltage electrode layer 1006 may have a comb shape in a plan view, as shown in FIG. 7, for electrical insulation from the connection line BL1. For example, when the common voltage electrode layer 1006 includes, as a single layer, the second sub-layer 1126 described above with reference to FIG. 6, a planar shape of the second sub-layer 1126 may be the same or substantially the same as the comb shape of the common voltage electrode layer 1006 shown in FIG. 7. In some embodiments, when the common voltage electrode layer 1006 includes the first sub-layer 1116 and the second sub-layer 1126, as described above with reference to FIG. 6, the planar shape of the second sub-layer 1126 may be the same or substantially the same as the comb shape of the common voltage electrode layer 1006 shown in FIG. 7.

A portion of the connection line BL1 may be arranged in a concave area formed in the common voltage electrode layer 1006, and the second light-emitting diode LED2 disposed over the first driving circuit 11 and the common voltage electrode layer 1006 may be electrically connected to the sub-pixel circuit PC arranged at (e.g., in or on) the first display area DA1 through the connection line BL1.

According to the above-described embodiments, a display device capable of reducing or preventing heat generation of a power supply line, while also reducing an area occupied by the power supply line, may be provided. However, the spirt and scope of the present disclosure are not limited by these aspects and features.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:

a first light-emitting diode at a first display area;

a second light-emitting diode at a second display area outside of the first display area, the second light-emitting diode comprising a first electrode, a second electrode on the first electrode, and an emission layer between the first electrode and the second electrode;

a plurality of sub-pixel circuits at the first display area;

a driving circuit at the second display area, and configured to provide a scan signal to each of the plurality of sub-pixel circuits;

a common voltage supply line at a non-display area outside of the second display area; and a common voltage electrode layer on the common voltage supply line, and electrically connected to the common voltage supply line, wherein at least a portion of an emission area of the second light-emitting diode, at least a portion of the first electrode of the second light-emitting diode, a portion of the second electrode of the second light-emitting diode, a portion of the common voltage electrode layer, and at least a portion of the driving circuit overlap with each other at the second display area, and wherein the common voltage electrode layer comprises a plurality of layers at different layers from one another, and at least a portion of each of the plurality of layers of the common voltage electrode layer overlaps with the first electrode of the second light-emitting diode at the second display area.

2. The display device of claim 1, wherein the common voltage electrode layer covers at least a portion of the common voltage supply line, and at least a portion of the driving circuit.

3. The display device of claim 1, wherein the second light-emitting diode is electrically connected to one of the plurality of sub-pixel circuits through a connection line extending from the second display area toward the first display area.

4. The display device of claim 3, wherein the common voltage electrode layer comprises a first layer at a same layer as that of the connection line, the first layer including a same material as that of the connection line.

5. The display device of claim 1, wherein the common voltage electrode layer comprises a metal layer or a transparent conductive material layer.

6. The display device of claim 1, further comprising a connection electrode layer on the common voltage electrode layer, and electrically connected to the common voltage electrode layer, wherein the connection electrode layer is at a same layer as that of a first electrode of the first light-emitting diode and the first electrode of the second light-emitting diode.

7. The display device of claim 6, wherein a second electrode of the first light-emitting diode and the second electrode of the second light-emitting diode extends onto the connection electrode layer, and directly contacts an upper surface of the connection electrode layer to be electrically connected to the connection electrode layer.

8. The display device of claim 1, further comprising an encapsulation member covering the first light-emitting diode and the second lightemitting diode.

9. The display device of claim 8, wherein the encapsulation member comprises a thin-film encapsulation layer comprising at least one inorganic encapsulation layer and at least one organic encapsulation layer, and wherein the driving circuit overlaps with the at least one inorganic encapsulation layer and the at least one organic encapsulation layer.

10. A display device comprising:

a first light-emitting diode at a first display area;

a plurality of sub-pixel circuits at the first display area;

a driving circuit at a second display area, and configured to provide a scan signal to each of the plurality of sub-pixel circuits, the second display area being outside of the first display area;

a second light-emitting diode at the second display area;

a common voltage supply line at a non-display area outside of the second display area; and a common voltage electrode layer on the common voltage supply line, and electrically connected to the common voltage supply line, the common voltage electrode layer comprising a plurality of layers at different layers from one another, wherein a portion of each of the plurality of layers of the common voltage electrode layer extends from the non-display area toward the second display area, and overlaps with an emission area of the second light-emitting diode at the second display area, and wherein the portion of each of the plurality of layers of the common voltage electrode layer is located between the driving circuit and the second light-emitting diode in a cross-sectional view.

11. The display device of claim 10, wherein the second light-emitting diode is electrically connected to one of the plurality of sub-pixel circuits through a connection line extending from the second display area toward the first display area.

12. The display device of claim 10, wherein the common voltage electrode layer comprises a metal layer or a transparent conductive material layer.

13. The display device of claim 10, further comprising a connection electrode layer on the common voltage electrode layer, and electrically connected to the common voltage electrode layer, wherein the connection electrode layer is at a same layer as that of a first electrode of each of the first light-emitting diode and the second light-emitting diode, and wherein a second electrode of the first light-emitting diode and the second light-emitting diode extends onto the connection electrode layer, and directly contacts an upper surface of the connection electrode layer to be electrically connected to the connection electrode layer.

14. The display device of claim 10, wherein the common voltage electrode layer covers at least a portion of the common voltage supply line and at least a portion of the driving circuit.

15. The display device of claim 10, wherein the second light-emitting diode overlaps with the driving circuit at the second display area.

16. The display device of claim 10, further comprising an encapsulation member covering the first light-emitting diode and the second light-emitting diode.

17. The display device of claim 16, wherein the encapsulation member comprises a thin-film encapsulation layer comprising at least one inorganic encapsulation layer and at least one organic encapsulation layer, and wherein the driving circuit overlaps with the at least one inorganic encapsulation layer and the at least one organic encapsulation layer.

* * * * *